(12) United States Patent
Meck

(10) Patent No.: US 7,265,618 B1
(45) Date of Patent: Sep. 4, 2007

(54) RF POWER AMPLIFIER HAVING HIGH POWER-ADDED EFFICIENCY

(75) Inventor: Ronald A. Meck, Soquel, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/564,548

(22) Filed: May 4, 2000

(51) Int. Cl.
*H03F 3/217* (2006.01)
(52) U.S. Cl. ...................................... 330/251; 330/310
(58) Field of Classification Search ................ 330/251, 330/302, 310, 150, 133, 98
See application file for complete search history.

(56) References Cited

U.S. PATENT DOCUMENTS

| | | | | |
|---|---|---|---|---|
| 3,794,920 A | * | 2/1974 | Darrow | 375/309 |
| 3,919,656 A | | 11/1975 | Sokal et al. | 330/51 |
| 4,771,247 A | * | 9/1988 | Jacomb-Hood | 330/277 |
| 5,023,566 A | * | 6/1991 | El-Hamamsy et al. | 330/251 |
| 5,151,852 A | * | 9/1992 | Jacobson et al. | 363/131 |
| 5,179,511 A | * | 1/1993 | Troyk et al. | 363/131 |
| 5,256,987 A | | 10/1993 | Kibayashi et al. | 330/295 |
| 5,373,251 A | * | 12/1994 | Kuitomo et al. | 330/302 |
| 5,745,857 A | * | 4/1998 | Maeng et al. | 330/310 |
| 5,818,880 A | * | 10/1998 | Kriz et al. | 330/251 |
| 5,939,941 A | * | 8/1999 | Nair et al. | 330/251 |
| 5,942,946 A | * | 8/1999 | Su et al. | 330/310 |
| 5,982,236 A | * | 11/1999 | Ishikawa et al. | 330/302 |

(Continued)

FOREIGN PATENT DOCUMENTS

JP          08051327 A   *   8/1994

OTHER PUBLICATIONS

Steve Hung-Lung Tu et al., "Highly Efficient CMOS Class E Power Amplifier for Wireless Communications." Circuits and Systems, 1998 ISCAS '98 IEEE Intl Symposium on Monterey CA, 4 pp.

*Primary Examiner*—Khanh Van Nguyen
(74) *Attorney, Agent, or Firm*—McDermott Will & Emery LLP

(57) ABSTRACT

The present invention, generally speaking, provides an RF power amplifier that exhibits high PAE at high output powers. The design of the power amplifier is based on the observation that the switching transistor is controlled by either voltage (for a FET) or current (for bipolar transistors), but not both. Thus, it is not necessary to develop power from the driver amplifier in order to operate the final stage as a switch. This recognition runs exactly counter to conventional wisdom, i.e., the concept of impedance matching for interstage design of high efficiency power amplifiers. It is impossible to develop solely a voltage waveform or a current waveform in a passband (resonant) network such as an RF power amplifier—both voltages and current must exist. In accordance with one aspect of the invention, however, instead of maximizing power transfer, power consumption is reduced while maintaining the magnitude of the voltage (or current) waveform. In accordance with another aspect of the invention, the driver is designed to, along with the final stage, operate in switch mode. In this instance, the design of the interstage network is similar to that of a Class E output stage. In the case of the interstage network, however, the objective is not to develop maximum power across the load (as in the case of the Class E output stage). Rather, the objective is to develop the maximum voltage across the driver's load (which is the switch input). In this arrangement, the input drive of the switch may be sufficiently high that the operating voltage of the driver stage may be reduced. This reduction further reduces the DC supply power to the driver, enhancing PAE.

9 Claims, 3 Drawing Sheets

U.S. PATENT DOCUMENTS

| | | | |
|---|---|---|---|
| 6,052,029 A | * | 4/2000 | Uda et al. .................. 330/302 |
| 6,111,459 A | | 8/2000 | Nishijima et al. ............ 330/51 |
| 6,118,991 A | * | 9/2000 | Jean et al. ................. 330/310 |
| 6,229,392 B1 | * | 5/2001 | Porter et al. ................ 330/251 |
| 6,313,706 B1 | * | 11/2001 | Kakuta et al. .............. 330/302 |

* cited by examiner

RF POWER AMPLIFIER HAVING HIGH POWER-ADDED EFFICIENCY

BACKGROUND OF THE INVENTION

1. Field of the Invention

The present invention relates to RF power amplifiers.

2. State of the Art

Battery life is a significant concern in wireless communications devices such as cellular telephones, pagers, wireless modems, etc. Radio-frequency transmission, especially, consumes considerable power. A contributing factor to such power consumption is inefficient power amplifier operation. A typical RF power amplifier for wireless communications operates with only about 10% efficiency. Clearly, a low-cost technique for significantly boosting amplifier efficiency would satisfy an acute need.

A power amplifier typically includes multiples stages, for example a final output stage and one or more pre-amplifier or driver stages. Much work has been done on maximizing the efficiency of the final output stage. A significant improvement in the efficiency of the final output stage was achieved with the advent of the Class E power amplifier, described in U.S. Pat. No. 3,919,656, incorporated herein by reference. In a Class E amplifier, the current and voltage waveforms of a switch are phased such that during switching one of the two quantities is at or near zero, minimizing power dissipation.

The Class E amplifier established the operation and design of the final stage of an amplifier operating in switch-mode. As a result, it is well-understood in the art of RF power amplifiers that to improve the conversion efficiency of supplied DC power to output power, the amplifier must be operated in a nonlinear manner—the most nonlinear operation possible of an amplifying element (such as a transistor) being operation as a switch. Indeed, the reported output efficiencies of switch-mode RF power amplifiers (e.g., Class E) are significantly higher (e.g., 80%) than mildly nonlinear amplifiers such as Class AB (e.g., 45%).

To operate an RF power amplifier in switch mode, it is necessary to drive the output transistor(s) rapidly between cutoff and full-on, and then back to cutoff, in a repetitive manner. The means required to achieve this fast switching is dependent on the type of transistor chosen to be used as the switch: for a field-effect transistor (FET), the controlling parameter is the gate-source voltage, and for a bipolar transistor (BJT, HBT) the controlling parameter is the base-emitter current.

Various designs have attempted to improve on different aspects of the basic Class E amplifier. One such design is described in Choi et al., A Physically Based Analytic Model of FET Class-E Power Amplifiers—Designing for Maximum PAE, IEEE Transactions on Microwave Theory and Techniques, Vol. 47, No. 9, September 1999, incorporated herein by reference. This contribution models various non-idealities of the FET switch and from such a model derives conclusions about advantageous Class E amplifier design. For the chosen topology, maximum power-added efficiency (PAE) of about 55% occurs at a power level of one-half watt or less. At higher powers, PAE is dramatically reduced, e.g., less than 30% at 2 W.

The PAE of a power amplifier is set by the amount of DC supply power required to realize the last 26 dB of gain required to achieve the final output power. (At this level of gain, the power input to the amplifier through the driving signal—which is not readily susceptible to measurement—becomes negligible.) Presently, there are no known amplifying devices capable of producing output powers of 1 W or greater at radio frequencies and that also provide a power gain of at least 26 dB. Accordingly, one or more amplifiers must be provided ahead of the final stage, and the DC power consumed by such amplifiers must be included in the determination of overall PAE.

Conventional design practice calls for an amplifier designer to impedance-match the driver output impedance to the input impedance of the final switching transistor. The actual output power therefore required from the driver stage is defined by the required voltage (or current) operating into the (usually low) effective input impedance of the switching element. A specific impedance for the input of the switching transistor is not definable, since the concept of impedance requires linear operation, and a switch is very nonlinear.

An example of an RF amplifier circuit in accordance with the foregoing approach is shown in FIG. 1. An interstage "L section" consisting of an inductor L1, a shunt capacitor C and an inductor L2 is used to match the driver stage to an assumed 50 ohm load (i.e., the final stage).

This conventional practice treats the interstage between the drive and final stages as a linear network, which it is not. Further, the conventional practice maximizes power transfer between the driver and final stages (an intended consequence of impedance matching). Thus, for example, in order to develop the required drive voltage for a FET as the switching transistor, the driver must also develop in-phase current as well to provide the impedance-matched power.

Another example of a conventional RF power amplifier circuit is shown in FIG. 2. This circuit uses "resonant interstage matching" in which the drive and final stages are coupled using a coupling capacitor Ccpl.

As noted, conventional design practice fails to achieve high PAE at high output power (e.g., 2 W, a power level commonly encountered during the operation of a cellular telephone). A need therefore exists for an RF power amplifier that exhibits high PAE at relatively high output powers.

SUMMARY OF THE INVENTION

The present invention, generally speaking, provides an RF power amplifier that exhibits high PAE at high output powers. The design of the power amplifier is based on the observation that the switching transistor is controlled by either voltage (for a FET) or current (for bipolar transistors), but not both. Thus, it is not necessary to develop power from the driver amplifier in order to operate the final stage as a switch. This recognition runs exactly counter to conventional wisdom, i.e., the concept of impedance matching for interstage design of high efficiency power amplifiers. It is impossible to develop solely a voltage waveform or a current waveform in a passband (resonant) network such as an RF power amplifier—both voltages and current must exist. In accordance with one aspect of the invention, however, instead of maximizing power transfer, power consumption is reduced while maintaining the magnitude of the voltage (or current) waveform. In accordance with another aspect of the invention, the driver is designed to, along with the final stage, operate in switch mode. In this instance, the design of the interstage network is similar to that of a Class E output stage. In the case of the interstage network, however, the objective is not to develop maximum power across the load (as in the case of the Class E output stage). Rather, the objective is to develop the maximum voltage across the driver's load (which is the switch input). In this arrangement, the input drive of the switch may be sufficiently high that the operating voltage of the driver stage may be reduced. This reduction further reduces the DC supply power to the driver, enhancing PAE.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
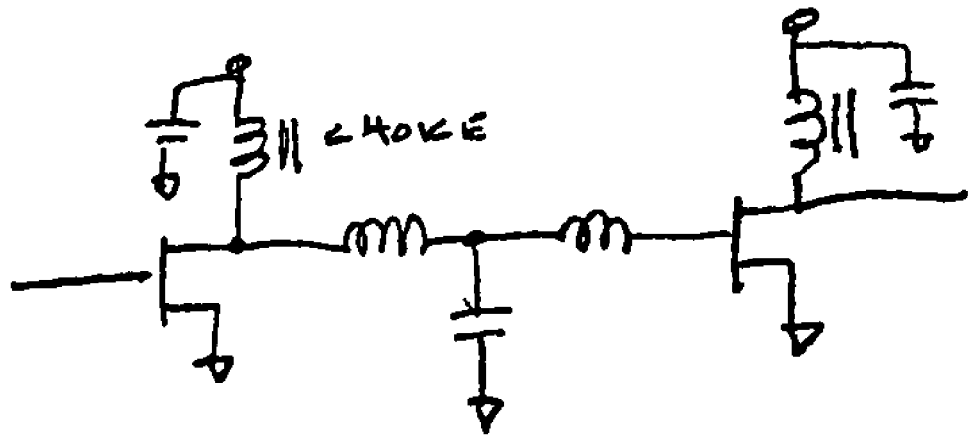
FIG. 1 is a schematic diagram of a conventional RF power amplifier circuit.
Figure 2:
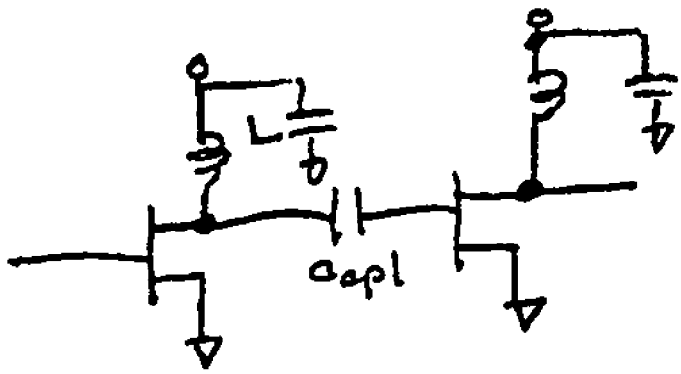
FIG. 2 is a schematic diagram of another conventional RF power amplifier circuit.
Figure 3:
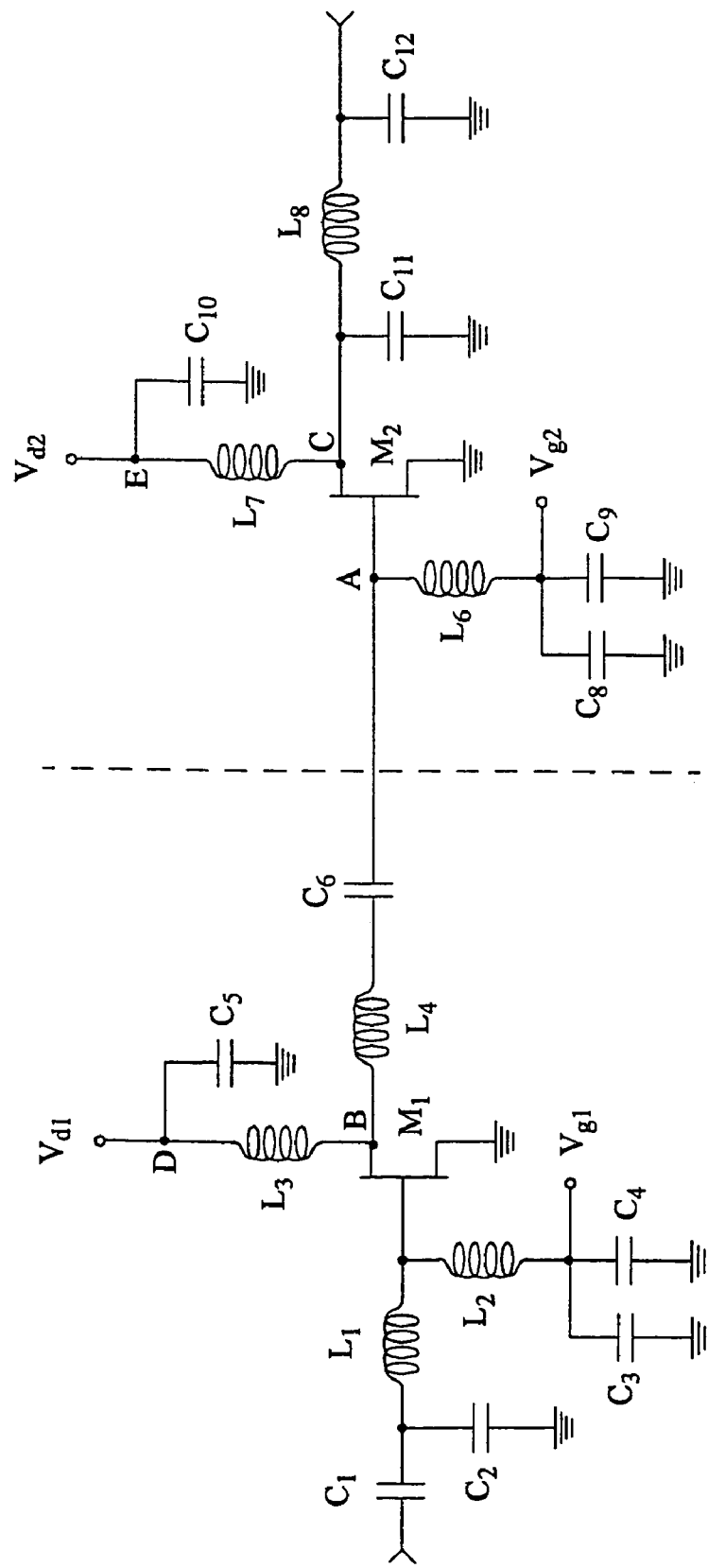
FIG. 3 is a schematic diagram of an RF power amplifier circuit in accordance with the present invention.

Referring now to FIG. 3, a schematic diagram is shown of an RF power amplifier circuit in accordance with an exemplary embodiment. An input matching circuit composed of a coupling capacitor $C_1$, a capacitor $C_2$ and an inductor $L_1$ is used to set the input impedance of the circuit. A driver stage $M_1$ and a final stage $M_2$ are shown as FETs, although in other embodiments bipolar transistors may be used. The drain electrode of the FET $M_1$ is coupled to a supply voltage $V_{d1}$ through a drain bias network including an RF choke $L_3$ and a capacitor $C_5$. Similarly, the drain electrode of the FET $M_2$ is coupled to a supply voltage $V_{d2}$ through a drain bias network including an RF choke $L_7$ and a capacitor $C_{10}$.

Respective gate bias networks are provided for the stages $M_1$ and $M_2$. In the case of the stage $M_1$, the gate bias network is composed of an inductor $L_2$, a capacitor $C_3$ and a capacitor $C_4$ connected at a common node to a voltage $V_{g1}$. In the case of the stage $M_2$, the gate bias network is composed of an inductor $L_6$, a capacitor $C_8$ and a capacitor $C_9$ connected at a common node to a voltage $V_{g2}$.

The driver stage and the final stage are coupled by an interstage network, shown here as a series LC combination composed of an inductor $L_4$ and a capacitor $C_6$, values of which are chosen so as to provide a resonance with the input capacitance of the final stage $M_2$. The final stage $M_2$ is coupled to a conventional load network, illustrated in this example as a CLC Pi network composed of a capacitor $C_{11}$, an inductor $L_8$ and a capacitor $C_{12}$, values of which are determined in accordance with characteristics of the final stage $M_2$.

In an exemplary embodiment, component values may be as follows, where capacitance is measured in picofarads and inductance is measured in nanohenries:

TABLE 1

| Capacitor | pf | Inductor | nh | Voltage | V |
|---|---|---|---|---|---|
| $C_1$ | 27 | $L_1$ | 8.2 | $V_{d1}$ | 3.3 |
| $C_2$ | 10 | $L_2$ | 33 | $V_{d2}$ | 3.2 |
| $C_3$ | 0.01 | $L_3$ | 33 | $V_{g1}$ | −1.53 |
| $C_4$ | 27 | $L_4$ | 4.7 | $V_{g2}$ | −1.27 |
| $C_5$ | 27 | $L_5$ | NA | | |
| $C_6$ | 27 | $L_6$ | 39 | | |
| $C_7$ | NA | $L_7$ | 15 | | |
| $C_8$ | 27 | $L_8$ | 2.7 | | |
| $C_9$ | 0.01 | | | | |
| $C_{10}$ | 27 | | | | |
| $C_{11}$ | 1.5 | | | | |
| $C_{12}$ | 5.6 | | | | |

Figure 4:
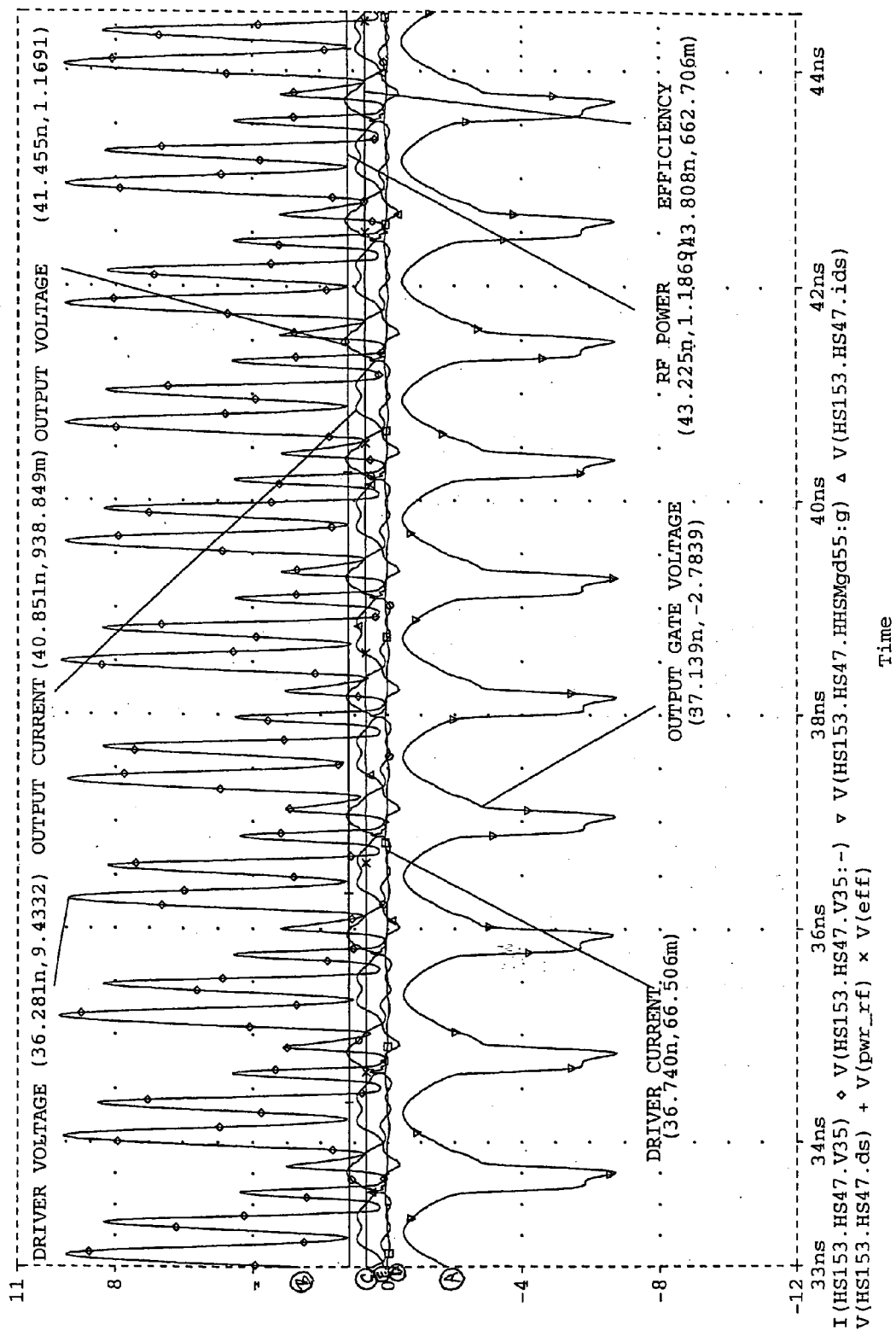
FIG. 4 is a waveform diagram showing waveforms occurring at selected nodes of the amplifier circuit of FIG. 3.

In the example of FIG. 3, the driver stage, stage $M_1$, is operated in switch mode. Referring to FIG. 4, waveforms diagrams are provided showing the input voltage to the stage $M_2$ at node A, the drain voltage of the stage $M_1$ at node B, the drain voltage of the stage $M_2$ at node C, the drain current of the stage $M_1$ at node D, and the drain current of the stage $M_2$ at node E. Note that the peak value of the gate voltage of the final stage, stage $M_2$ (waveform A), is considerably greater than in conventional designs. In this arrangement, the input drive of the switch may be sufficiently high that the operating voltage of the driver stage may be reduced. This reduction further reduces the DC supply power to the driver, enhancing PAE.

From the foregoing component values and from the waveform diagram of FIG. 4, it will be appreciated that the RF amplifier described operates in the UHF range, commonly understood to be 300 to 3000 MHz. Using circuits of the type illustrated, PAE of 72% has been measured at an output power of 2 W.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of operating a UHF power amplifier of a UHF transmitter, the UHF power amplifier having a final amplification stage that exhibits parasitic input capacitance and a preceding driver amplification stage, comprising:

operating the final amplification stage in switch mode; and coupling the driver amplification stage to the final amplification stage using an interstage network including a selected series inductor having a value such that the selected series inductor and the parasitic input capacitance form a series resonant circuit within an output frequency band.

2. The method of claim 1, wherein the driver amplification stage is operated in switch mode.

3. A multistage amplifier, comprising:

a first amplifier stage;

a second amplifier stage configured for switch mode operation; and an interstage network coupling the first amplifier stage to the second amplifier stage, said interstage network having a series LC circuit with a selected inductor, a selected capacitor, and a parasitic input capacitance of the second amplifier stage, said series LC circuit having an impedance within a frequency band of interest that increases the power added efficiency of the multistage amplifier over that obtainable in a multistage amplifier employing an impedance-matched interstage network.

4. The multistage amplifier of claim 3 wherein the frequency band of interest comprises the UHF band.

5. The multistage amplifier of claim 3 wherein the first amplifier stage is configured to operate in switch mode.

6. A method of increasing the power efficiency of a multistage amplifier, comprising:

providing a first amplifier stage;

providing a second amplifier stage;

configuring the second amplifier stage to operate as a switch mode amplifier; and coupling an interstage network between an output of the first amplifier stage and an input of the second amplifier stage, said interstage network having a series LC circuit with a selected inductor, a selected capacitor, and a parasitic input capacitance of the second amplifier stage, said series LC circuit having an impedance in a frequency band of interest that allows the magnitude of a drive signal produced by the first amplifier stage to remain substantially unchanged when transmitted to the input of the second amplifier stage.

7. The method of claim 6 wherein the drive signal is either a voltage signal of a current signal.

8. The method of claim 6 wherein the first amplifier stage is configured to operate as a switch mode amplifier.

9. The method of claim 6 wherein the frequency band of interest is the UHF band.

* * * * *